United States Patent
Kwon

Patent Number: 6,091,112
Date of Patent: Jul. 18, 2000

[54] SILICON ON INSULATOR SEMICONDUCTOR SUBSTRATE AND FABRICATION METHOD THEREFOR

[75] Inventor: Oh-Kyong Kwon, Seoul, Rep. of Korea

[73] Assignee: LG Semicon Co., Ltd., Cheongju, Rep. of Korea

[21] Appl. No.: 08/991,247

[22] Filed: Dec. 16, 1997

[30] Foreign Application Priority Data

Dec. 24, 1996 [KR] Rep. of Korea ............... 96-71299

[51] Int. Cl.[7] ............... H01L 27/01; H01L 27/12
[52] U.S. Cl. ............... 257/347; 257/349; 438/455; 438/459
[58] Field of Search ............... 257/347, 349; 148/DIG. 43, DIG. 51, DIG. 93; 428/446; 438/455, 459

[56] References Cited

U.S. PATENT DOCUMENTS

| | | | |
|---|---|---|---|
| 5,308,776 | 5/1994 | Gotou | 438/459 |
| 5,773,152 | 6/1998 | Okonogi | 257/347 |
| 5,773,352 | 6/1998 | Hamajima | 438/406 |
| 5,786,615 | 7/1998 | Saito | 257/347 |

*Primary Examiner*—Donald L. Monin, Jr.
*Attorney, Agent, or Firm*—Fleshner & Kim, LLP

[57] ABSTRACT

An SOI semiconductor substrate and a fabrication method therefor which are capable of preventing a depletion region due to a fixed electric charge occurring at a junction surface from being formed in a silicon wafer within which an integrated circuit is to be formed. The SOI semiconductor substrate includes a first silicon wafer, a first oxide layer formed on an upper surface of the first silicon wafer, an undoped polysilicon layer formed on an upper surface of the first oxide layer, and a second silicon wafer formed on an upper surface of the polysilicon layer.

12 Claims, 4 Drawing Sheets

SILICON ON INSULATOR SEMICONDUCTOR SUBSTRATE AND FABRICATION METHOD THEREFOR

BACKGROUND OF THE INVENTION

1. Field of the Invention

The present invention relates to a semiconductor substrate and a fabrication method therefor, and in particular to a semiconductor substrate and a fabrication method therefor which are capable of avoiding the problems of a conventional SOI (Silicon On Insulator) substrate.

2. Description of the Conventional Art

Recently, an SOI (Silicon On Insulator) substrate structure which is known as the next generation semiconductor substrate, is increasingly used in order to reduce a parasitic effect of the substrate which occurs in conventional integrated circuits and to effectively separate devices and circuits from one another in an integrated circuit.

FIGS. 1A through 1C are cross-sectional views illustrating a conventional SOI substrate and a fabrication method thereof. As shown in FIG. 1A, an oxide layer 13 which acts as an insulation layer, is formed on a first silicon wafer 11 which is capable of having an integrated circuit formed thereon. As shown in FIG. 1B, a second silicon wafer 15 which is used as a base substrate, is mounted on the oxide layer 13 by a thermal bonding method, etc. Finally, as shown in FIG. 1C, the resultant structure is inverted, and an upper surface of the first silicon wafer 11 is polished to a predetermined thickness, thus forming an SOI structure substrate.

Generally, when forming an oxide layer on a silicon layer under a high temperature environment, various electric charges are formed on the surface of the silicon layer. Therefore, when the oxide layer 13 is formed on the first silicon wafer 11 under a high temperature environment, various electric charges are formed on the surface of the first silicon wafer 11 or within the oxide layer 13. In addition, fixed electric charges are formed within the oxide layer 13 to a depth of about 35 Å from the surface of the first silicon wafer 11, and these electric charges which are positive electric charges are not mobile under an applied external field, differently from other electric charges. A negative depletion charge is formed in the first silicon wafer 11 in which the devices are to be integrated by the positive fixed electric charges. The region in which the depletion electric charges are formed affects the breakdown voltage characteristic of a device. Namely, since the depletion electric charge region is previously formed before electrical power is externally supplied to the integrated circuit, when the electrical power is actually supplied thereto, the breakdown voltage of the device drops, which is undesirable when implementing a device which requires a high breakdown voltage.

Therefore, when fabricating an SOI substrate as shown in FIG. 1C and forming an oxide layer on the silicon substrate, the oxide layer is formed such that the density of the fixed electric charges formed on the surface of the oxide layer is controlled within a density (about $10^{10}$ cm$^{-2}$) which does not affect the threshold voltage of the device. However, a problem occurs when the density of the fixed electric charges is formed identically in the junction surface during the joining under a high temperature environment, or when the density of the electric charge below the density (about $10^{10}$ cm$^{-2}$) therein is formed. Currently, the above-described problems have not been resolved. Namely, the density of the fixed electric charge formed at the boundary surface between the first silicon wafer 11 and the oxide layer 13 formed thereon can be controlled below about $10^{10}$ cm$^{-2}$, by controlling the growing condition of the oxide layer 13. However, since the density of the fixed charge formed at the boundary surface between the oxide layer 13 and the second silicon wafer 15 which are bonded at a high temperature is $10^{11}$ cm$^{-2}$ at maximum, the depletion layer is formed before a voltage is supplied to the first silicon wafer 11, so that a parasitic phenomenon occurs in the devices of the integrated circuit.

SUMMARY OF THE INVENTION

Accordingly, it is an object of the present invention to provide a semiconductor substrate and a fabrication method therefor which overcome the aforementioned problems encountered in the conventional art.

It is another object of the present invention to provide an improved SOI semiconductor substrate and a fabrication method thereof which are capable of preventing a depletion region from being formed in a silicon wafer within which an integrated circuit is to be formed.

To achieve the above objects, there is provided a semiconductor substrate according to the present invention which includes a first silicon wafer, a first oxide layer formed on an upper surface of the first silicon wafer, an undoped polysilicon layer formed on an upper surface of the first oxide layer, and a second silicon wafer bonded on an upper surface of the polysilicon layer.

To achieve the above objects, there are provided three SOI semiconductor substrate fabrication methods. Namely, there is also provided a semiconductor substrate fabrication method according to a first embodiment, which includes the steps of forming a first silicon wafer, forming a first oxide layer on the first silicon wafer, depositing an undoped polysilicon layer on he first oxide layer, bonding the second silicon wafer on the polysilicon layer, and polishing a lower surface of the first silicon wafer.

To achieve the above objects, there is also provided a semiconductor substrate fabrication method according to a second embodiment, which includes the steps of preparing a first silicon wafer, forming a first oxide layer on the first silicon wafer, depositing an undoped polysilicon layer on the first oxide layer, forming a second oxide layer on the polysilicon layer, bonding the second silicon wafer on the second oxide layer, and polishing the lower surface of the first silicon wafer.

To achieve the above objects, there is also provided a semiconductor substrate fabrication method according to a third embodiment, which includes the steps of preparing a first silicon wafer, forming a first oxide layer on the first silicon wafer, depositing an undoped polysilicon layer on the first oxide layer, forming a second oxide layer on the second silicon wafer, bonding the second oxide layer formed on the second silicon wafer and the polysilicon layer formed on the first oxide layer, and polishing the lower surface of the first silicon wafer.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The semiconductor substrate and the fabrication method therefor according to a second embodiment of the present invention will now be explained with reference to the accompanying drawings.

Figure 1A:
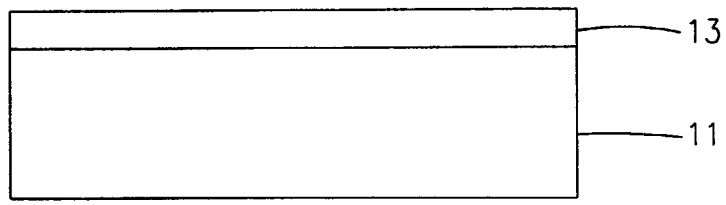
FIGS. 1A through 1C are cross-sectional views illustrating a conventional SOI substrate and a fabrication method thereof.
Figure 1B:
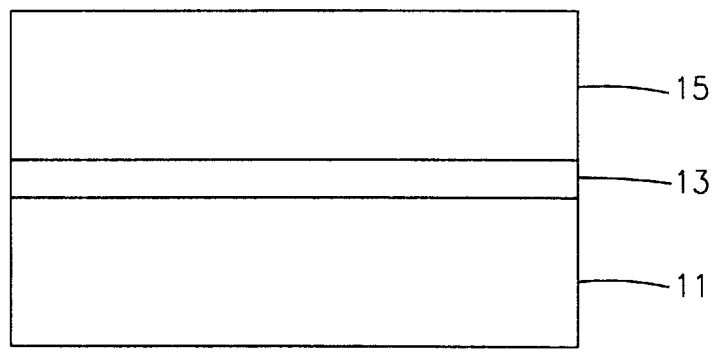
Figure 1C:
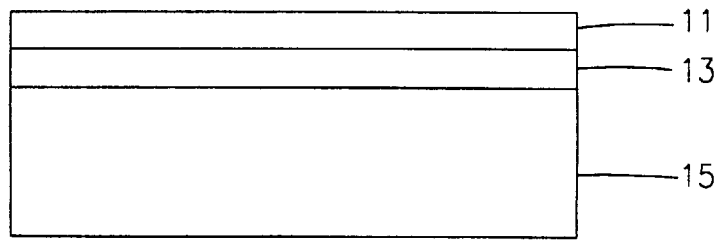
Figure 2:
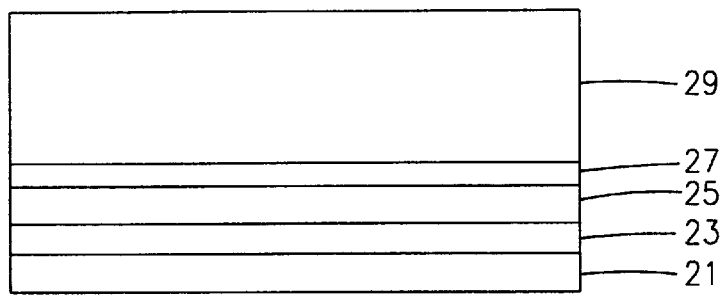
FIG. 2 is a cross-sectional view illustrating a semiconductor substrate according to a second embodiment of the present invention.

FIG. 2 illustrates a semiconductor substrate according to the second embodiment of the present invention. As shown therein, the semiconductor substrate includes a first silicon wafer 21 which is capable of having an integrated circuit formed thereon, a first oxide layer 23 formed on the upper surface of the first silicon wafer 21 to a thickness less than 3 $\mu$m, and an undoped polysilicon layer 25 which acts as an insulation material formed on the upper surface of the first oxide layer 23 to a thickness of about 0.5~4 $\mu$m. A second oxide layer 27 is formed on the upper surface of the polysilicon layer 25 to a thickness less than 1.5 $\mu$m, and a second silicon wafer 29, which becomes a base substrate is bonded on the upper surface of the second oxide layer 27. When using the semiconductor substrate as shown in FIG. 2, the thusly formed resultant structure is inverted in order for the first silicon wafer 21 to be on top. And, then the first silicon wafer is polished to a predetermined thickness so that the integrated circuit is easily configured. Thereafter, an integrated circuit (not shown) is formed on the first silicon wafer 21.

Figure 3:
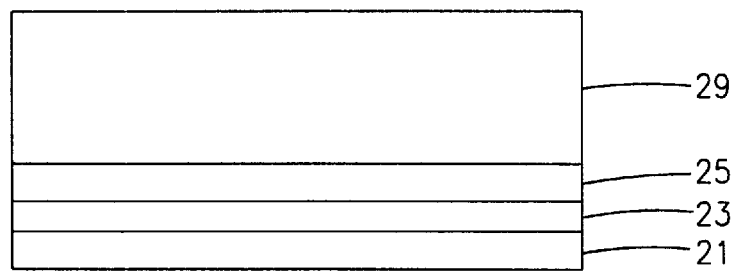
FIG. 3 is a cross-sectional view illustrating a semiconductor substrate according to a first embodiment of the present invention.

FIG. 3 illustrates a semiconductor substrate according to a first embodiment of the present invention. As shown therein, the first oxide layer 23 is formed on the first silicon wafer 21, and the undoped polysilicon layer 25 is formed on the first oxide layer 23, and the second silicon wafer 29 is bonded on the polysilicon layer 25. Namely, in the first embodiment of the present invention, the second oxide layer 27 shown in FIG. 2 illustrating the semiconductor substrate according to the first embodiment of the present invention is not formed.

Figure 4:
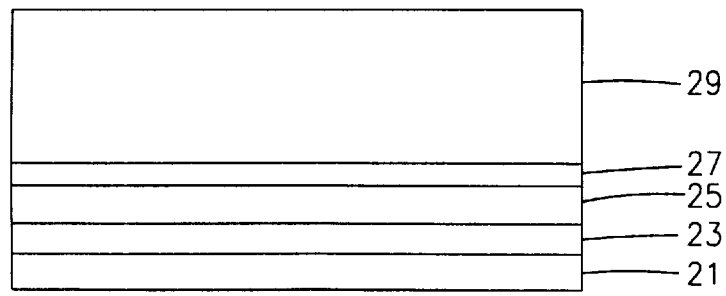
FIG. 4 is a cross-sectional view illustrating a semiconductor substrate according to a third embodiment of the present invention.

FIG. 4 is a cross-sectional view illustrating a semiconductor substrate according to a third embodiment of the present invention. As shown therein, a first oxide layer 23 is formed on a first silicon wafer 21, and an undoped poly silicon layer 25 is deposited on the first oxide layer 23, and a second oxide layer 27 is formed on the second silicon wafer 29, and then the second oxide layer 27 and the polysilicon layer 25 are bonded. Thereafter, the lower surface of the first silicon wafer 21 is polished.

As shown in the drawings, the structure of the third embodiment of the present invention is the same as the second embodiment of the present invention. However, the fabrication methods are different therebetween.

The semiconductor substrate fabrication method according to the present invention will now be explained with reference to FIGS. 5A through 5E.

Figure 5A:
FIGS. 5A through 5E are cross-sectional views illustrating a second semiconductor substrate fabrication method according to the present invention.
Figure 5B:
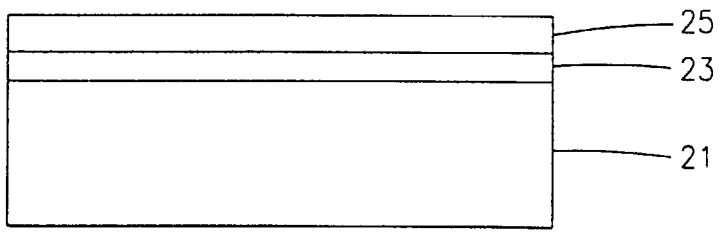

First, as shown in FIG. 5A, the first oxide layer 23 is formed on the first silicon wafer 21 to a thickness less than 3 $\mu$m, and as shown in FIG. 5B, the undoped polysilicon layer 25 is formed on the first oxide layer 23 to a thickness of about 0.5~4 $\mu$m. The undoped polysilicon layer 25 acts as an insulation material.

Figure 5C:
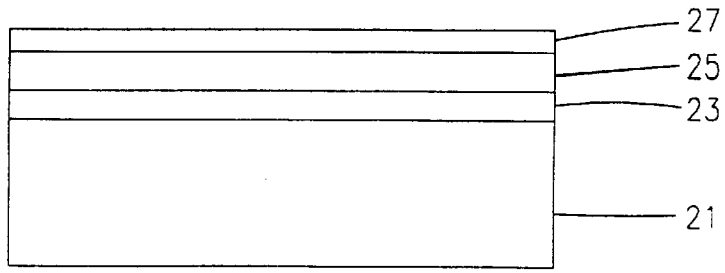
Figure 5D:
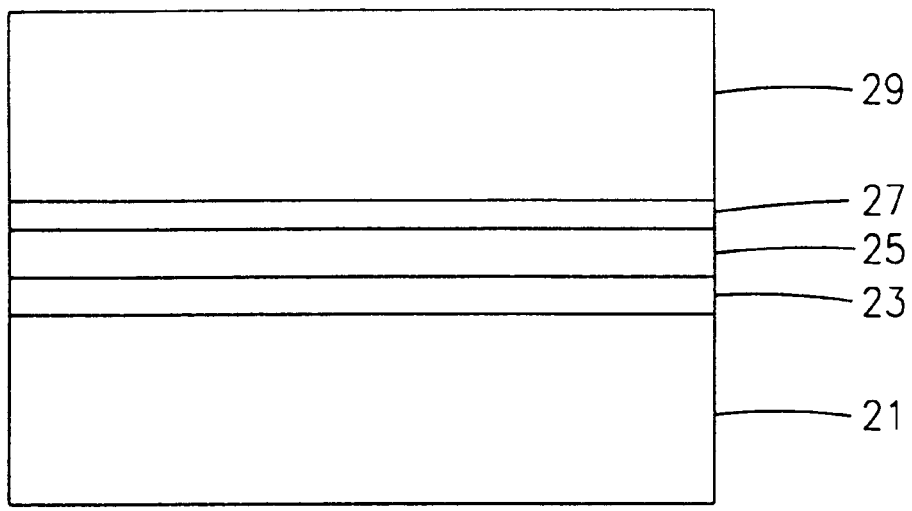

As shown in FIG. 5C, the second oxide layer 27 is formed on the polysilicon layer 25 to a thickness less than 1.8 $\mu$m, and as shown in FIG. 5D, the second silicon wafer 29 is bonded on the second oxide layer 27 by a thermal bonding method. The second oxide layer 27 is formed to prevent twisting or warpage which may occur at the time of bonding the second silicon wafer 29 and the polysilicon layer 25 and to prevent any influence by the fixed charge, which has a relatively high density, formed on the bonded surface, upon the first silicon wafer 21.

Figure 5E:
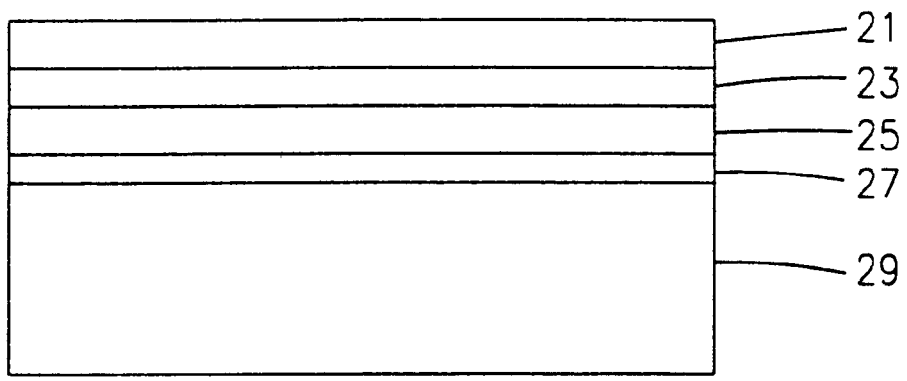

As shown in FIG. 5E, the resultant structure is inverted. The upper surface of the first silicon wafer 21 is polished to a predetermined thickness. Namely, the polishing is performed until the thickness of the first silicon wafer 21 becomes identical to the thickness of the silicon wafer layer in which an integrated circuit is to be formed in the SOI substrate, for thus fabricating the semiconductor substrate according to the present invention. The structure of the semiconductor substrate as shown in FIG. 5E is identical to the structure which is formed by inverting the semiconductor substrate as shown in FIG. 2.

As shown in FIG. 3, the second silicon wafer 29 may be directly bonded on the polysilicon layer 25, differently from the fabrication method wherein the second oxide layer 27 is formed on the polysilicon layer 25, and then the second silicon wafer 29 is formed on the oxide layer 27 as shown in FIG. 5D. In this case, the density of the fixed electric charge formed at the boundary surface between the first silicon wafer 21 and the first oxide layer 23, and the density of the fixed electric charge at the boundary surface between the first oxide layer 23 and the polysilicon layer 25 are almost similar. Since the fixed electric charge formed at the boundary surface between the polysilicon layer 25 and the second silicon wafer is blocked by the undoped polysilicon layer 25 which acts as an insulation material, the fixed electric charge does not affect the first silicon wafer 21 in which an integrated circuit is to be formed.

As shown in FIG. 4, the structure of the semiconductor substrate is the same as the substrate structure of the second embodiment shown in FIG. 2. However, in the fabrication method, the second oxide layer is not formed on the polysilicon layer like the second embodiment of the present invention. Namely, the second oxide layer is grown on the second silicon wafer, and the growth condition thereof is controlled so that it is possible to control a fixed electric charge density at a boundary therebetween.

As described above, in the semiconductor substrate and the fabrication method therefor according to the present invention, since the electrical charge densities formed at the first boundary surface between the first silicon wafer 21 and the first oxide layer 23, at the second boundary surface between the first oxide layer 23 and the polysilicon layer 25, and at the third boundary surface between polysilicon layer 25 and the second oxide layer 27 are similar, a depletion region is not formed in the first silicon wafer 21 in which an integrated circuit is to be formed. Therefore, it is possible to prevent a parasitic effect in the devices of the integrated circuit due to the depletion region. In addition, the fixed electrical charge density at the boundary surface between the second oxide layer 27 and the second silicon wafer 29 may be higher than the density of the fixed electric charge at another boundary surface. Therefore, since the fixed electric charge is blocked by the polysilicon layer 25 which acts as an insulation material, the first silicon wafer 21 is not affected at the time of forming an integrated circuit.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A silicon-on-insulator semiconductor substrate, comprising:

a first silicon wafer;

a first oxide layer formed on an upper surface of the first silicon wafer;

an undoped polysilicon layer formed directly on an upper surface of the first oxide layer; and a second silicon wafer bonded directly onto an upper surface of the polysilicon layer.

2. The substrate of claim 1, wherein said first oxide layer is formed to a thickness less than approximately 3 $\mu$m.

3. The substrate of claim 1, wherein said polysilicon layer is formed to a thickness of between approximately 0.5~4 $\mu$m.

4. A silicon-on-insulator semiconductor substrate fabrication method, comprising the steps of:

forming a first silicon wafer;

forming a first oxide layer on the first silicon wafer;

depositing an undoped polysilicon layer directly onto an upper surface of the first oxide layer;

bonding a second silicon wafer directly onto an upper surface of the polysilicon layer; and polishing a lower surface of the first silicon wafer.

5. The method of claim 4, wherein said first oxide layer is formed to a thickness less than approximately 3 $\mu$m.

6. The method of claim 4, wherein said polysilicon layer is formed to a thickness of approximately 0.5~4 $\mu$m.

7. The substrate of claim 1, where the first silicon wafer is an active, polished layer of the substrate.

8. The substrate of claim 1, where a thickness of the first silicon wafer is substantially the same as a thickness of the second silicon wafer.

9. A silicon-on-insulator semiconductor substrate fabrication method, comprising the steps of:

forming a first silicon wafer;

forming a first oxide layer on the first silicon wafer;

depositing an undoped polysilicon layer directly onto an upper surface of the first oxide layer once the first oxide layer has been formed on the first silicon wafer;

bonding a second silicon wafer directly onto an upper surface of the polysilicon layer once the undoped polysilicon layer has been deposited on the upper surface of the first oxide layer; and polishing a lower surface of the first silicon wafer, once the second silicon wafer has been bonded on the upper surface of the polysilicon layer.

10. The method of claim 9, wherein said first oxide layer is formed to a thickness less than approximately 3 $\mu$m.

11. The method of claim 9, wherein said polysilicon layer is formed to a thickness of between approximately 0.5–4 $\mu$m.

12. A silicon-on-insulator semiconductor substrate, comprising:

a first silicon wafer;

an oxide layer formed on an upper surface of the first silicon wafer;

an undoped polysilicon layer formed on an upper surface of the oxide layer, wherein said undoped polysilicon layer is formed to a thickness of between approximately 0.5–4 $\mu$m; and a second silicon wafer bonded on an upper surface of said polysilicon layer.

* * * * *